United States Patent [19]
Soclof

[11] Patent Number: 5,097,316
[45] Date of Patent: Mar. 17, 1992

[54] COMPLEMENTARY NPN AND PNP LATERAL TRANSISTORS SEPARATED FROM SUBSTRATE BY INTERSECTING SLOTS FILLED WITH SUBSTRATE OXIDE FOR MINIMAL INTERFERENCE THEREFROM

[75] Inventor: Sidney I. Soclof, San Gabriel, Calif.

[73] Assignee: Rockwell International Corporation, El Segundo, Calif.

[21] Appl. No.: 68,383

[22] Filed: Jun. 11, 1987

Related U.S. Application Data

[63] Continuation-in-part of Ser. No. 277,465, Jul. 25, 1981, abandoned.

[51] Int. Cl.$^5$ .................. H01L 29/72; H01L 29/06
[52] U.S. Cl. .................................... 357/55; 357/35
[58] Field of Search ............... 357/23.5, 35, 91, 44, 357/55

[56] References Cited

U.S. PATENT DOCUMENTS

| | | |
|---|---|---|
| 4,131,910 | 12/1978 | Hartman et al. |
| 4,140,558 | 2/1979 | Murphy et al. |
| 4,146,905 | 3/1979 | Appels et al. |
| 4,519,849 | 5/1985 | Korsh et al. |
| 4,641,170 | 2/1987 | Ogura et al. |

OTHER PUBLICATIONS

S. A. Evans et al., "A 1-Micron Bipolar VLSI Technology", *IEEE Transactions on Electron Devices*, vol. ED-27 (Aug. 1980), pp. 1373–1379.

K. Brack et al., "Lateral Nonuniform Doping of Semiconductor by Ion Implantation", *IBM Technical Disclosure Bulletin*, vol. 16, No. 10 (Mar. 1974), p. 3287.

K. Sekiyo et al., "Trench Self-Aligned EPROM Technology", 1986 VLSI Symposium (1986), three pages.

*Primary Examiner*—J. Carroll
*Attorney, Agent, or Firm*—H. Fredrick Hamann; George A. Montanye; Wilfred G. Caldwell

[57] ABSTRACT

The invention is a pair of complementary transistors or arrays thereof and method for producing same in submicron dimensions on a silicon substrate selectively doped P and N type by forming intersecting slots in spaced apart relation across the P substrate regions to define semi-arrays of V shaped intermediate regions which will become transistors. Silicon oxide fills these slots and separates the NPN transistor regions from the substrate. Orthogonal slots devide the semi-arrays into individual transistor active regions which are doped N and introduced into each active regions via the orthogonal slots and driven in to comprise the emitter and collector regions on respective sides of original substrate comprising the base regions. The same construction obtains in the N substrate regions to form the arrays of PNP transistors. Metallization patterns complete electrical interconnections to the emitter, base and collector regions and silicon oxide substantially covers the periphery of each active region for total isolation.

7 Claims, 11 Drawing Sheets

COMPLEMENTARY NPN AND PNP LATERAL TRANSISTORS SEPARATED FROM SUBSTRATE BY INTERSECTING SLOTS FILLED WITH SUBSTRATE OXIDE FOR MINIMAL INTERFERENCE THEREFROM

CROSS REFERENCE

This application is a continuation-in-part of Ser. No. 06/277,465 filed July 25, 1981 by the same inventor, abandoned.

FIELD OF THE INVENTION

This invention is a novel structure and method for forming sub-micron type lateral dielectrically isolated complementary transistors utilizing VLSI chip processing steps to compatibly fabricate hundreds of such devices, simultaneously on a common functional chip.

BACKGROUND OF THE INVENTION

Techniques extracted from the prior art come from the field of sub-micron fabrication technology wherein the dimensional resolution is now comparable to or even smaller than the thicknesses of the thermally grown silicon oxide layers on silicon. Also, the dimensions are now comparable or even smaller than the base widths used for diffused transistors, i.e., 0.4 to 1.0 micrometers. From these techniques, the novel structure and method for the complementary lateral transistors with greatly reduced parasitic capacitances and resistances are achieved.

SUMMARY OF THE INVENTION

The invention comprises novel lateral complementary transistors formed on a selectively doped substrate by intersecting slots and orthogonal slots for respectively defining each active region undercut by selective intersecting slots and filled with substrate oxide to isolate the effective regions from the substrate. Prior to oxidation filling the orthogonal slots, selective doping is introduced by angle implantation from opposed orthogonal surfaces of each individual active region to complete the NPN formations or the complementary PNP formations. The intersecting slots and the orthogonal slots of the complementary devices are respectively orthogonally related. Electrical connections are made in conventional fashion to become emitter, base and collector regions.

The following method of making extremely small contacts is an alternative method. It is applied to an NPN lateral bipolar transistor for illustrating versatility, but the principles apply equally to PNP, as outlined infra.

Figure 8A:
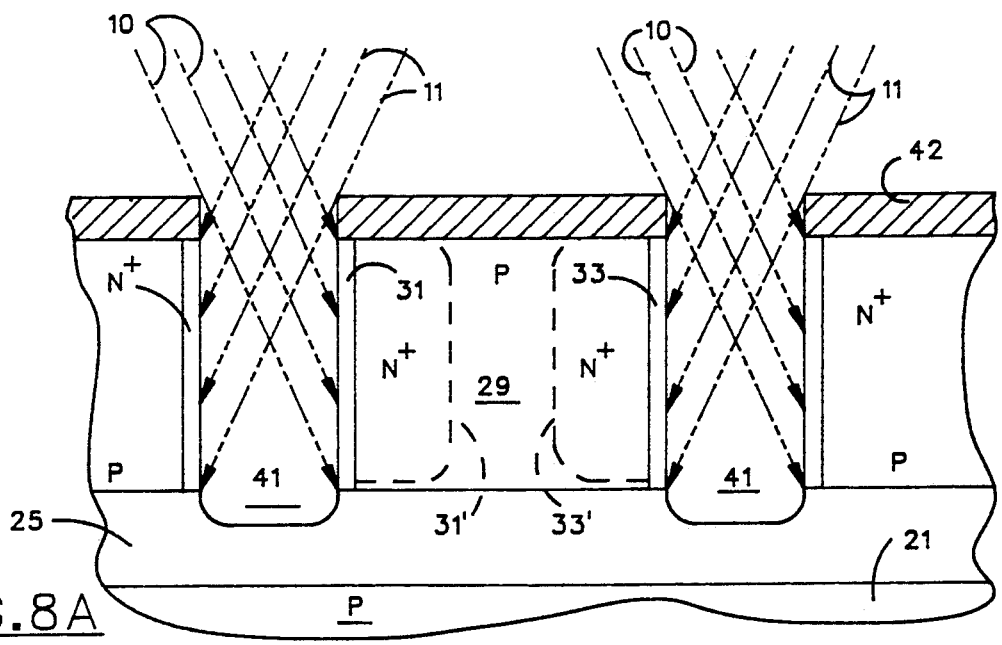
FIG. 8A illustrates angled doping.
Figure 8:
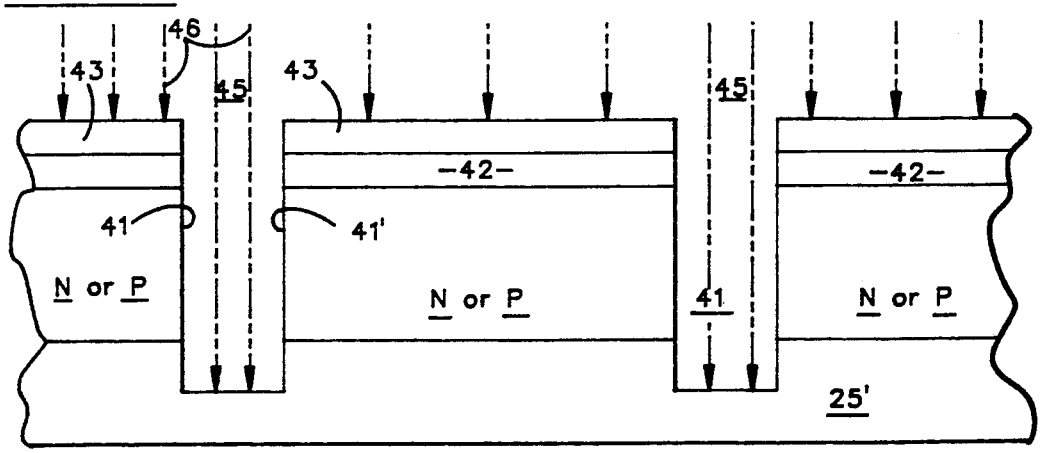
FIG. 8 shows the formation of the orthogonal slots via milling.
Figure 12:
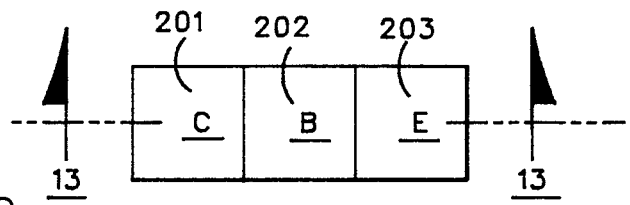
Figure 13:
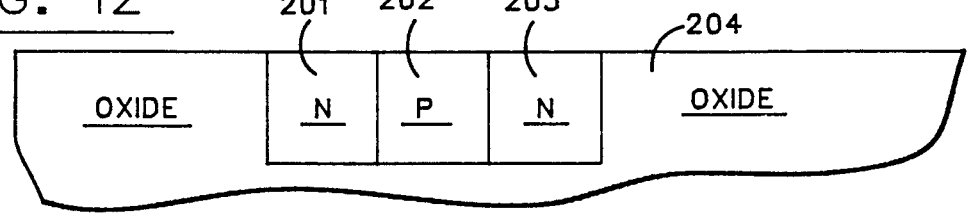
Figure 14:
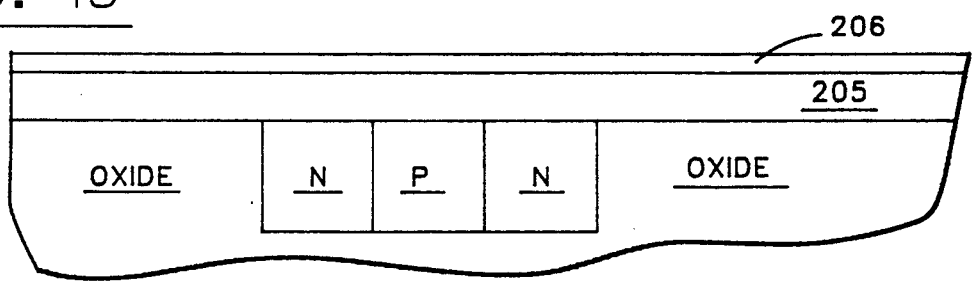
Figure 15:
Figure 16:
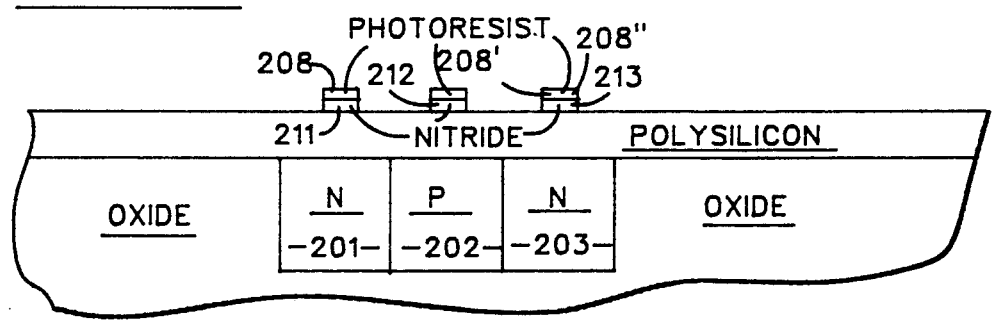
Figure 17:
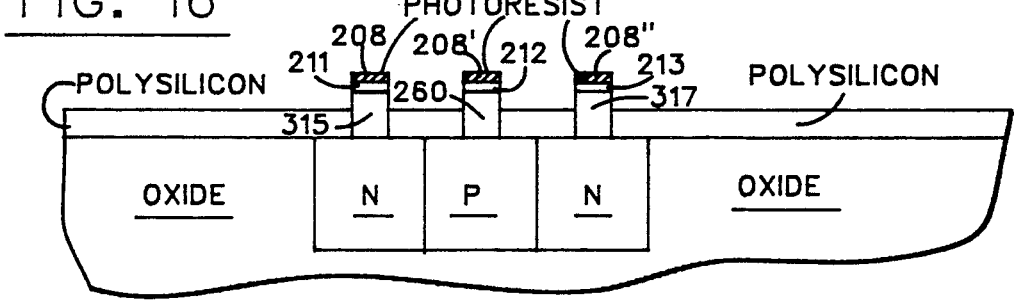
Figure 18:
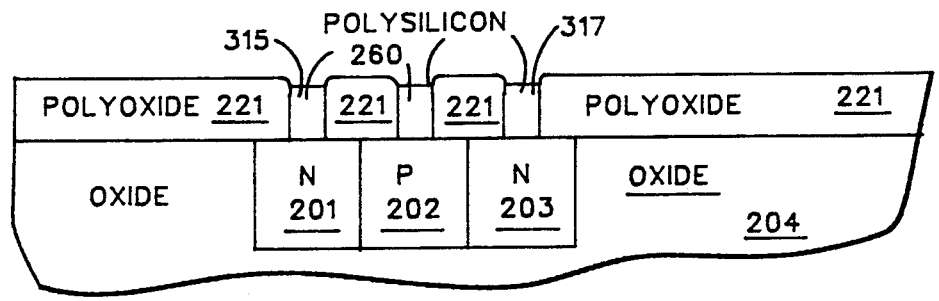
Figure 19:
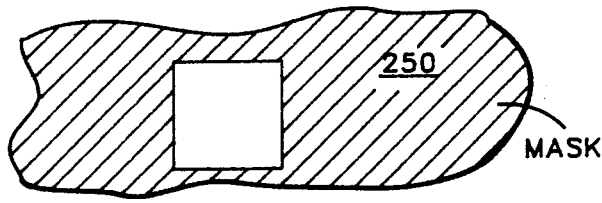
Figure 20:
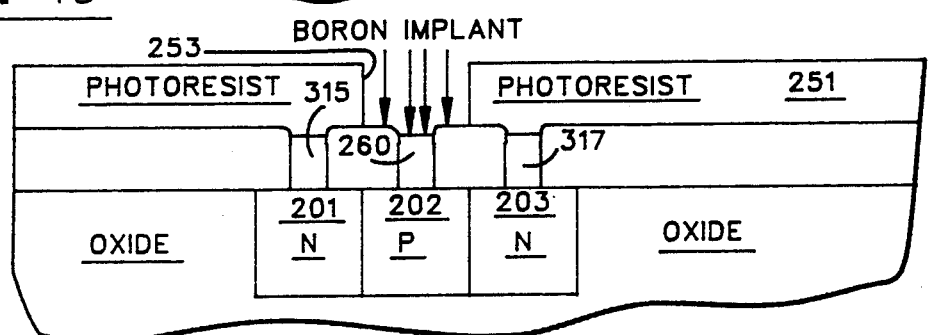
Figure 21:
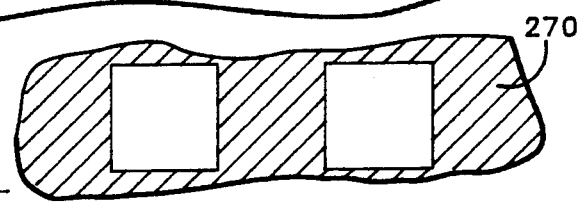
Figure 22:
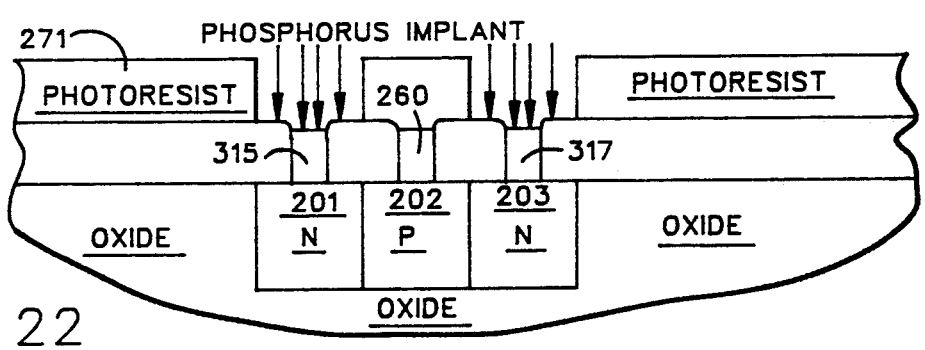
Figure 23:
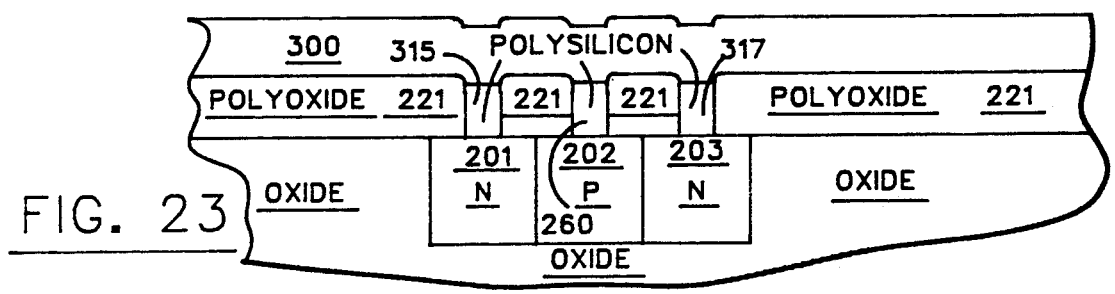
Figure 24:
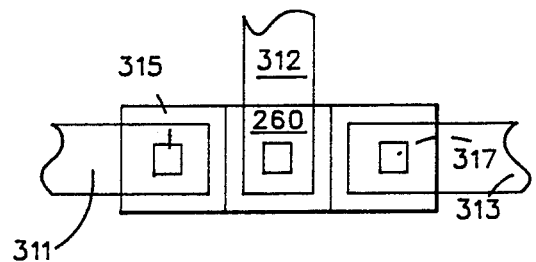
Figure 25:
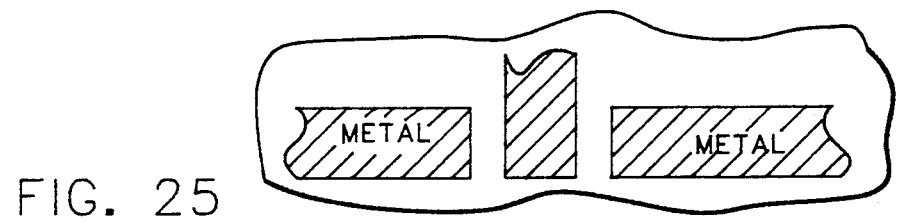
Figure 26:
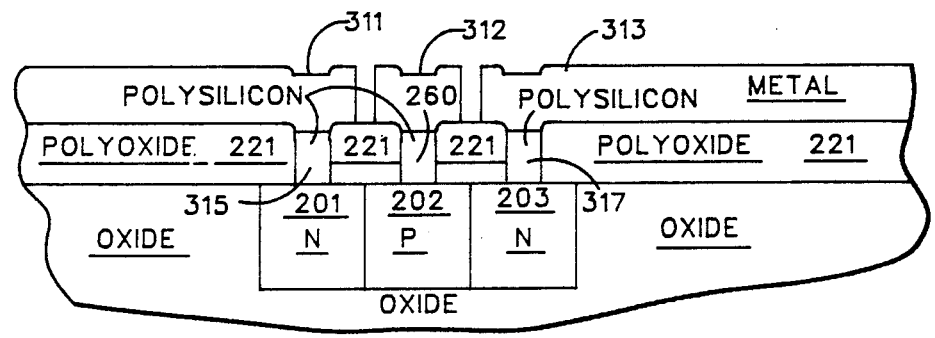
Figure 27:
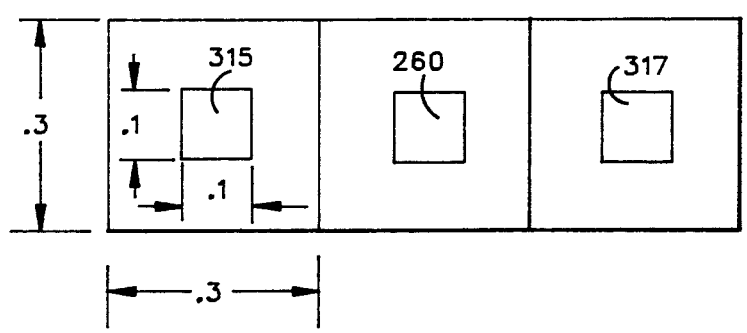

FIG. 12 is a view in top plan of a bipolar device of the type of FIG. 8 without the oxide overlay;

FIG. 13 shows the device of FIG. 12 in cross-section in field oxide;

FIG. 14 shows the application of a polysilicon layer covered by a nitride layer to the structure of FIG. 14;

FIG. 15 shows a contact mask;

FIG. 16 shows the nitride buttons remaining over each of the bipolar elements atop the polysilicon layer;

FIG. 17 shows the etching away of approximately ½ of the polysilicon layer prior to oxidation;

FIG. 18 shows the polysilicon layer converted to polyoxide except where the nitride buttons preserved the polysilicon;

FIG. 19 shows the mask for opening regions to the base electrode polysilicon;

FIG. 20 shows the boron implant to achieve the doping of the polysilicon electrode;

FIG. 21 shows a mask for opening regions to the collector and emitter (N regions);

FIG. 22 shows these regions opened and the polysilicon therein being doped by phosphorus implant;

FIG. 23 shows the nitride buttons removed and the layer of metal over top of the structure;

FIG. 24 shows the arrangement in top plan view as delineated by the mask of FIG. 25;

FIG. 26 shows the completed device following sintering; and,

FIG. 27 shows dimensions achievable in the contact region for these devices, the elements, such as the collector measuring 0.3 by 0.3 microns and the contact regions, such as 315 measuring 0.1 by 0.1 microns.

Figure 28:
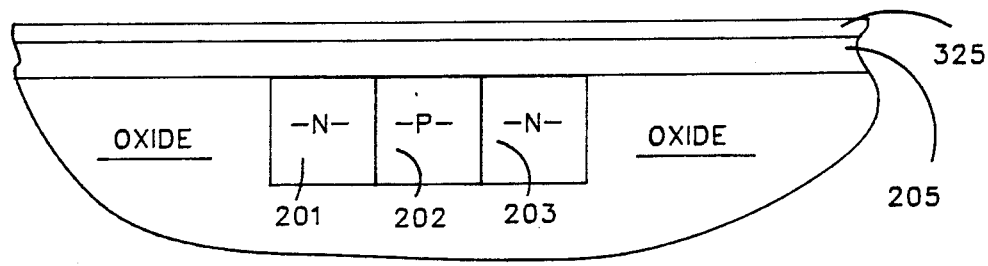
Figure 29:
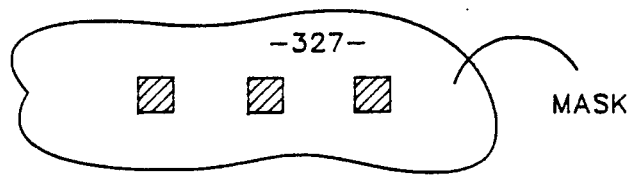
Figure 30:
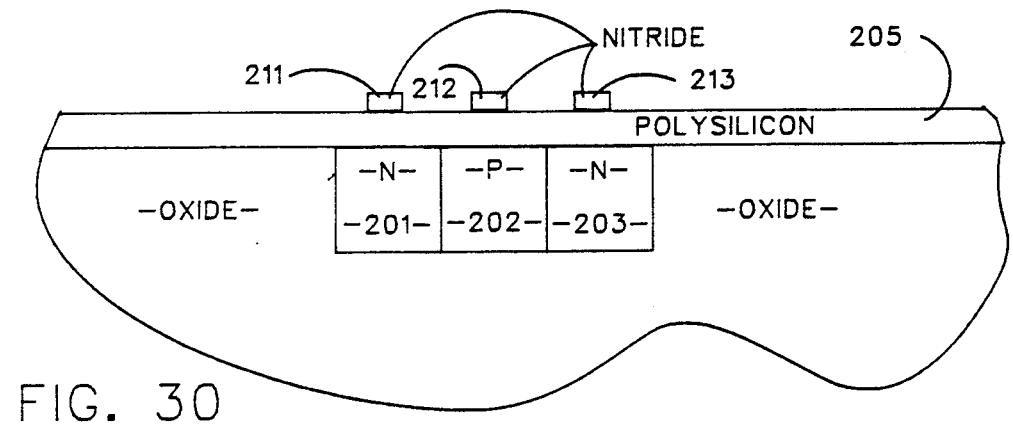
Figure 31:
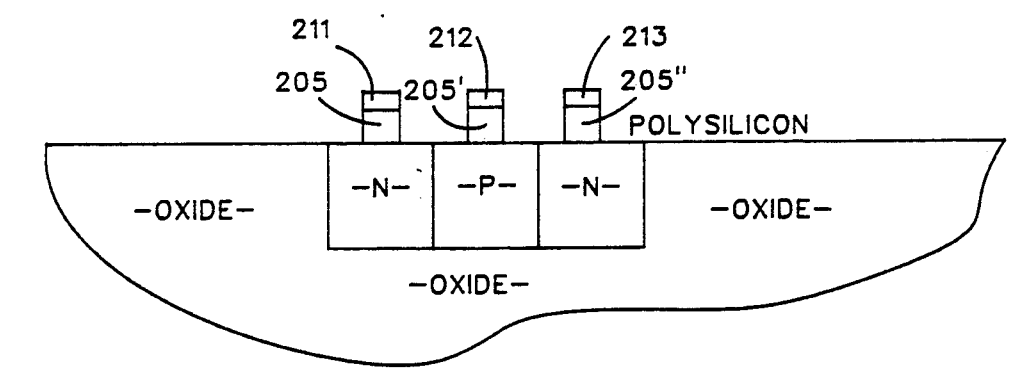
Figure 32:
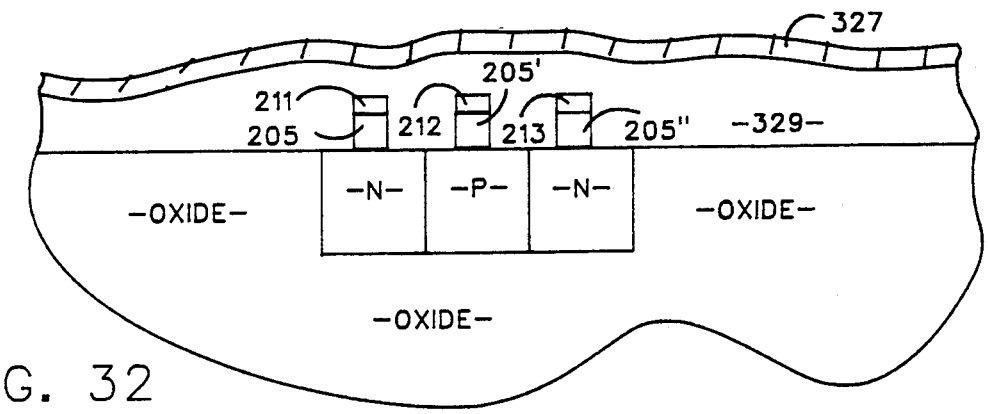
Figure 33:
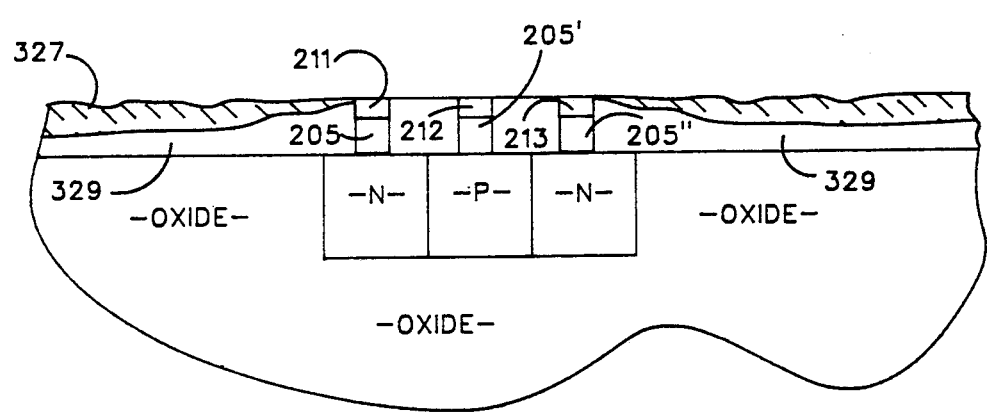
Figure 34:
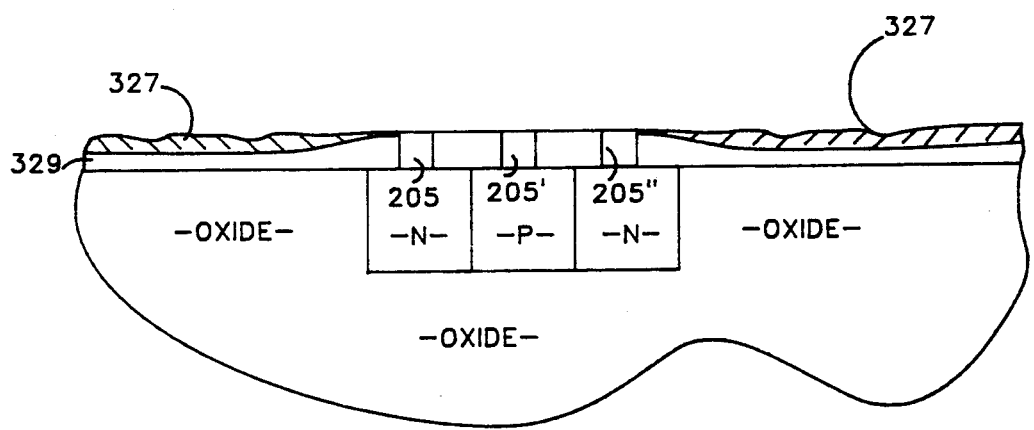
Figure 35:
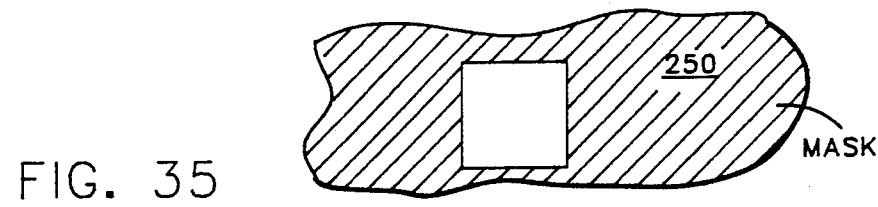
Figure 36:
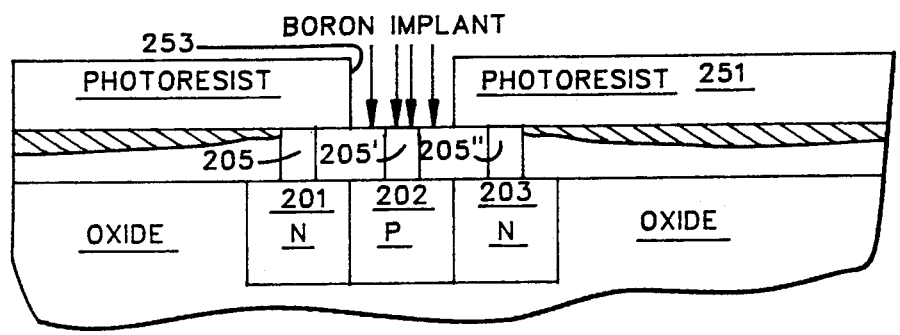
Figure 36A:
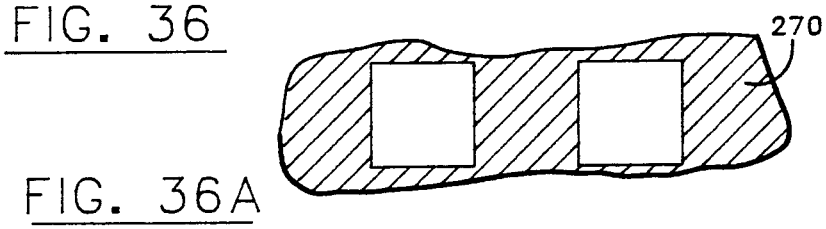
Figure 37:
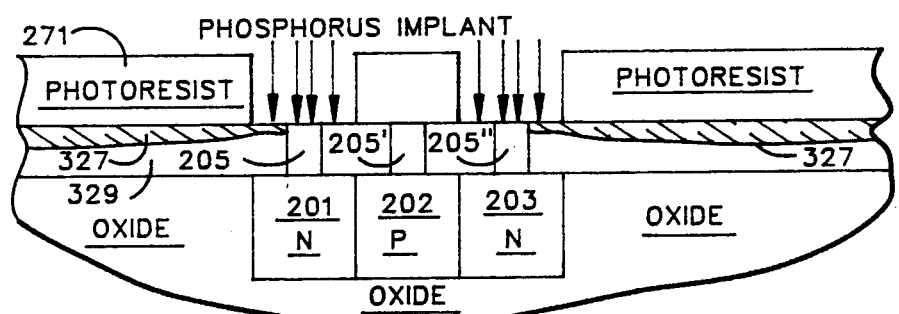
Figure 38:
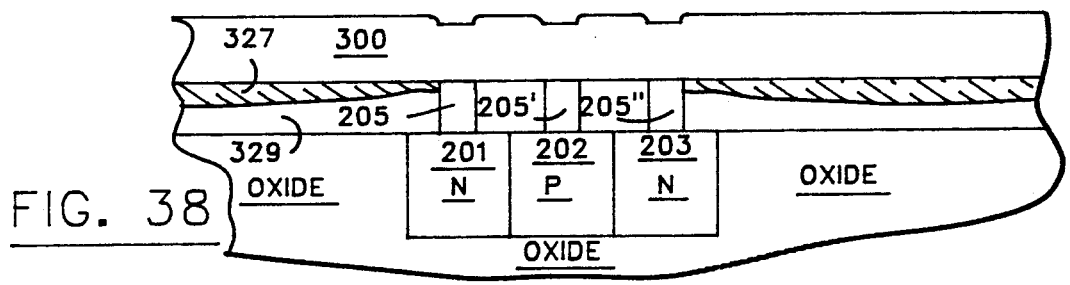
Figure 39:
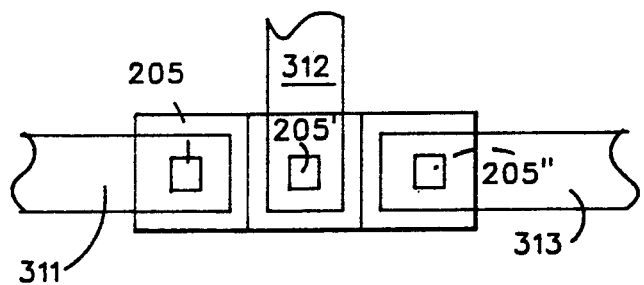
Figure 40:
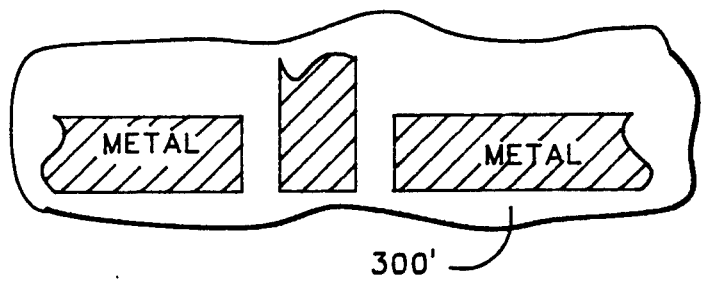
Figure 41:
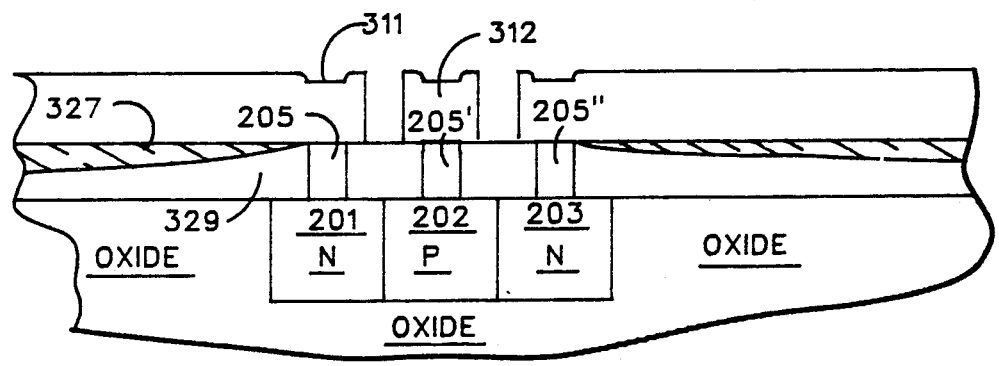
Figure 42:
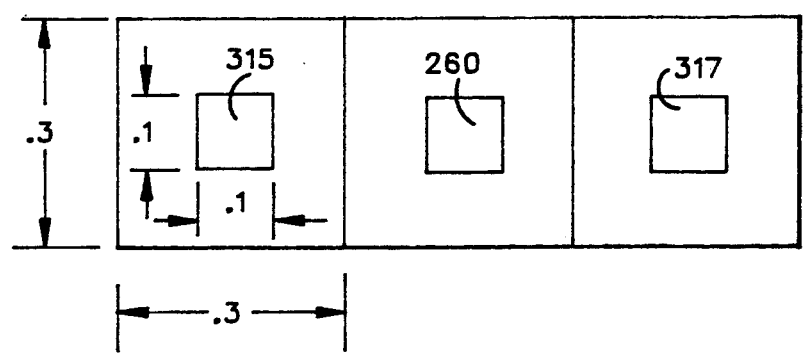

FIGS. 28–42 disclose yet another alternative method for forming the contacts;

FIG. 28 shows the NPN elements of a transistor being formed embedded in oxide and covered by a layer of polysilicon, in turn covered by a layer of nitride;

FIG. 29 is a contact mask;

FIG. 30 shows the nitride contact buttons;

FIG. 31 depicts the isolated polysilicon contacts;

FIG. 32 reveals the plasma oxide covering the contacts, and in turn covered by glass (SOG);

FIG. 33 planarizes the structure of FIG. 32 down to the tops of the nitride buttons;

FIG. 34 shows the structure of FIG. 33 with the nitride buttons removed;

FIG. 35 shows the mask to be used in making a doping opening to the base contact;

FIG. 36 shows the doping step for the base contact;

FIG. 36A shows a mask for making openings to the collector and emitter contacts;

FIG. 37 shows the doping step for the collector and emitter contacts;

FIG. 38 includes the metal interconnect layer;

FIG. 39 shows the delineated metal interconnects;

FIG. 40 shows the mask for effecting the delineation;

FIG. 41 shows the completed device, and,

FIG. 42 is an example of relative sizes available from this method.

BRIEF DESCRIPTION OF A PREFERRED EMBODIMENT

In the devices produced in accordance with the present invention, the effects of the substrate are minimized relative to the operation of the devices. It should be realized that the isolated active region may be completely contained within a surface area of approximately $5d \times 3d = 15d^2$ wherein d is only 0.4 micrometers. Each active region is completely separated from the substrate by substrate oxidation and the parasitic capacitances and resistances are almost completely reduced to a minimum value attainable because the transistors are reduced to just their electronically active regions. In the conventional (vertical) transistor, the electrically active region is only a very small fraction of the total transistor area or volume. The dielectric isolation between transistors offered by the substrate oxidation has advantages with respect high frequency performance, high voltage integrated circuits, radiation resistance, and circuit flexibility, i.e., the process provides NPN and PNP devices on the same integrated circuit chip.

Figure 1:
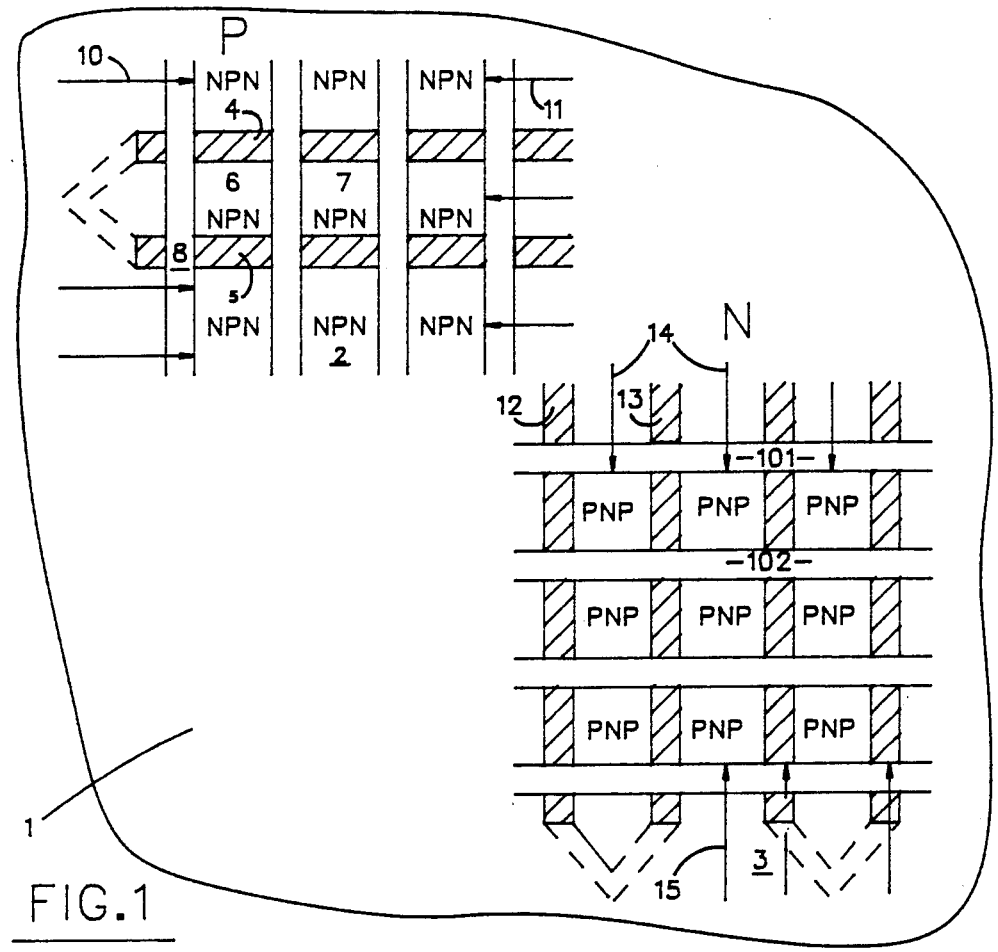
FIG. 1 shows a portion of a chip including separate formations of NPN and PNP devices.

In FIG. 1, the chip or die is partly shown at 1 carrying an NPN formation of transistors structures 2 and a separate PNP formation of transistor structures 3.

In formation 2, a pair of intersecting slots 4 and 5 form triangular shaped active regions 6 and 7 separated by orthogonal slots 8 and 9. The arrows 10 and 11 illustrate the angle doping paths (when tilted upwardly) for N or N+ doping of the underlying substrate. Subsequently, slots 8 and 9 are also filled with oxide and electrical connections are established to the electrode regions of the isolated active transistor regions.

In formation 3, the intersecting slots 12 and 13 of the P region are illustrated orthogonal to intersecting slots 4 and 5 of the N region 2, and the directions of angled doping, shown by arrows 14 and 15, is at right angles to arrows 10 and 11 of region 2. Since ion milling and ion doping are preferably employed, many regions, such as 2 and 3, may be selectively distributed across the chip 1, and accurately indexed by present day conventional techniques. This offers versatility of association of the complementary transistors. Use of the illustrated orthogonal relationship of slots 8 and 9 to slots 101 and 102 serves to prevent contaminating of doping (i.e.) N type doping is only injected at right angles to P type doping.

Figure 2:
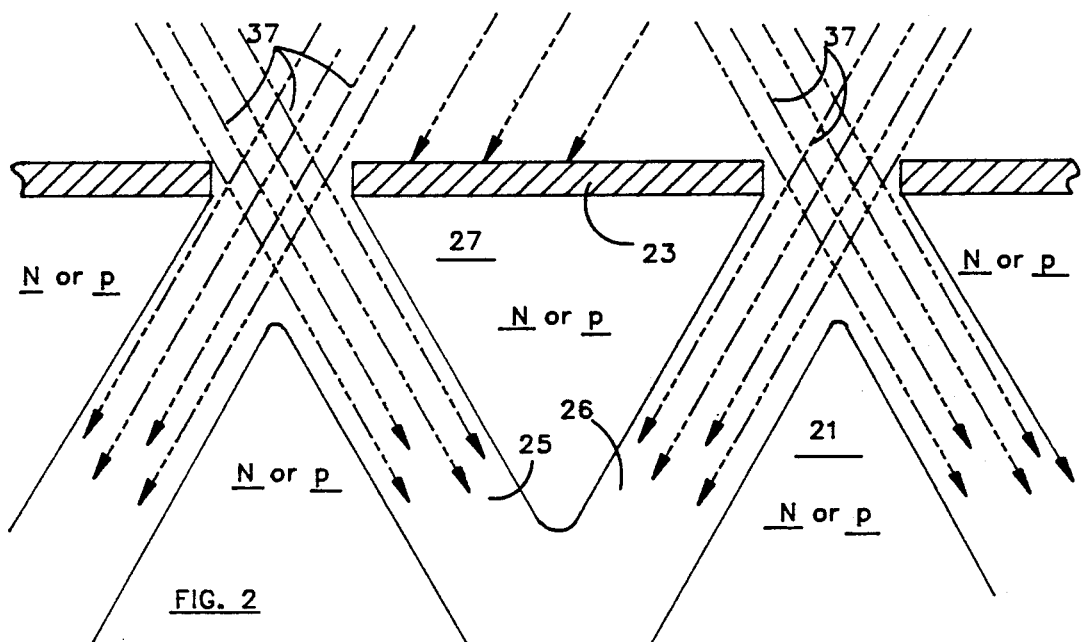
FIG. 2 is a cross sectional view through the substrate showing the formation of intersecting slots.

Referring now to FIG. 2, substrate 21 is masked by photoresist 23 which is patterned to define the penetration regions for intersecting slots 25 and 26. Since substrate 21 is shown doped N or P type, the intermediate region 27 will eventually comprise a plurality of transistors of either the NPN or PNP type, having been carved from the substrate by the slots 25 and 26. To prevent intermediate region 27, better defined as a semi-array of transistor regions, from falling into substrate 21, it should be noted that the slots 25 and 26 are interrupted to leave shoulders at spaced apart intervals therealong, best seen at 31, 32 and 33 in FIG. 5.

Since the preferred way of forming slots 25 and 26 is by ion milling, shown by the flux lines 37 in FIG. 2, the masking layer 23 is a material with a low sputtering rate, such as one of the heavier metals.

Figure 3:
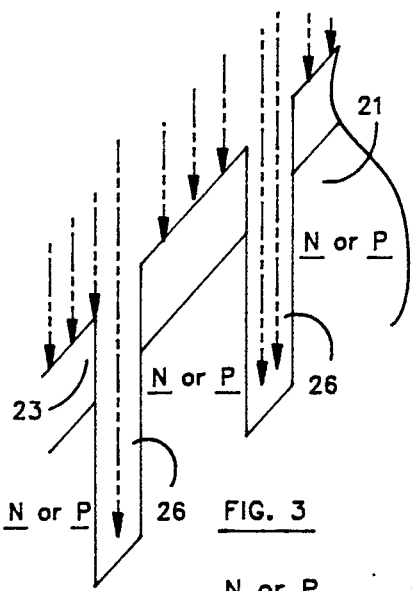
FIG. 3 shows a substrate oriented at an angle above the horizontal such that vertical milling may form the diagonally penetrating slots.
Figure 4:
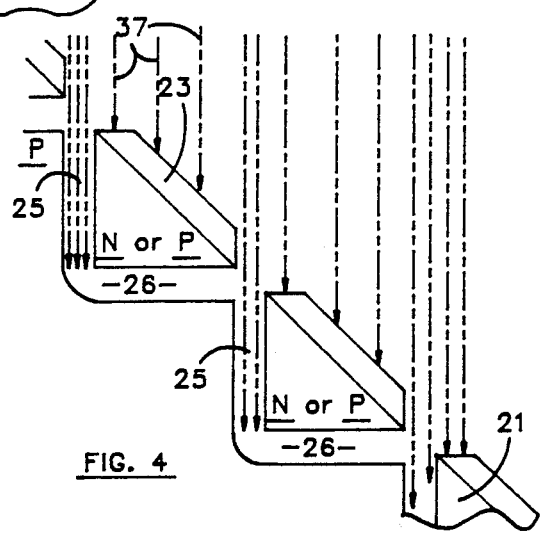
FIG. 4 shows the substrate oppositely oriented to that of FIG. 3 such that vertical milling may again form the other portion of the intersecting slots.

FIGS. 3 and 4 illustrate the ease of forming intersecting slots, such as 25 and 26, simply by orienting the substrate at angles, e.g., 60° to the horizontal, such that the ion flux 37 may remain in its vertical pattern to form, first slots 26, and thereafter slots 25 simply by rotating the substrate 21 through 90°. The flux may be accurately directed to any region 2 or 3.

While the triangular array 27 is shown as being substantially equilateral, it need not be and the angles may be varied to configure the active regions as desired for specific purposes. It will also be noticed from FIGS. 3 and 4 that slots 25 and 26 terminate where they intersect because extending them deeper into the substrate would serve no purpose.

Figure 5A:
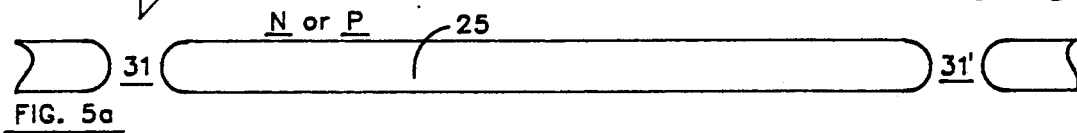
FIGS. 5a, 5b and 5c are views in top plan of a portion of the substrate showing three spaced apart slots separated from the substrate proper.
Figure 5B:
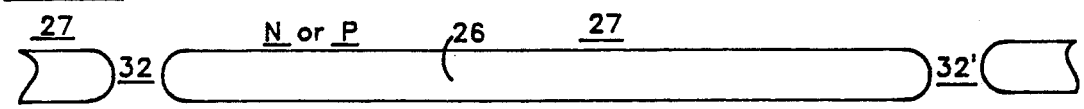
Figure 5C:
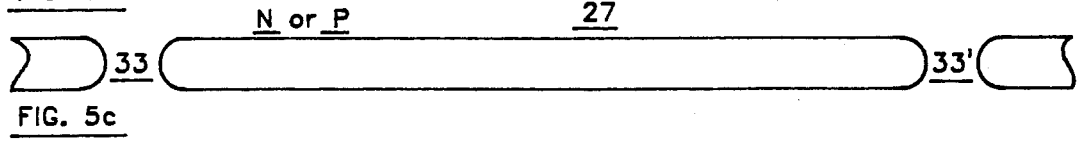

From FIGS. 5a, 5b and 5c, it may be seen that the slots 25 and 26 may be intermittent such that supporting ribs or webs 31, 32, 33 and 31', 32', 33' serve to support each semi-array 27. These webs or supports may be at spaced apart locations along the slots 25 and 26 or merely comprise only supports at the edges of the chips because they serve but a temporary purpose as the slots will be filled with substrate oxide to provide the permanent support for each transistor region.

Figure 6:
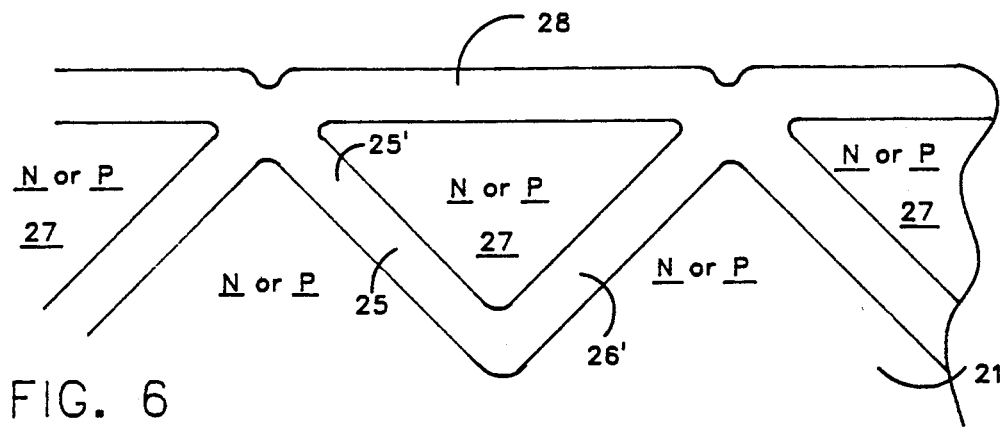
FIG. 6 is a front view of the triangular semi-arrays of substrate formed by the intersecting slots and separated from the substrate proper.

The first oxidation step is shown in FIG. 6 wherein silicon oxide 25' and 26' fills the respective slots 25 and 26. Also, an upper layer of silicon oxide 28 (FIG. 6) covers the upper surface and is contiguous with the silicon oxide 25' and 26' such that semi-array 27 is totally isolated from the substrate 21 by the silicon oxide, and the periphery of the semi-arrays 27 are substantially covered by the oxide.

Figure 7:
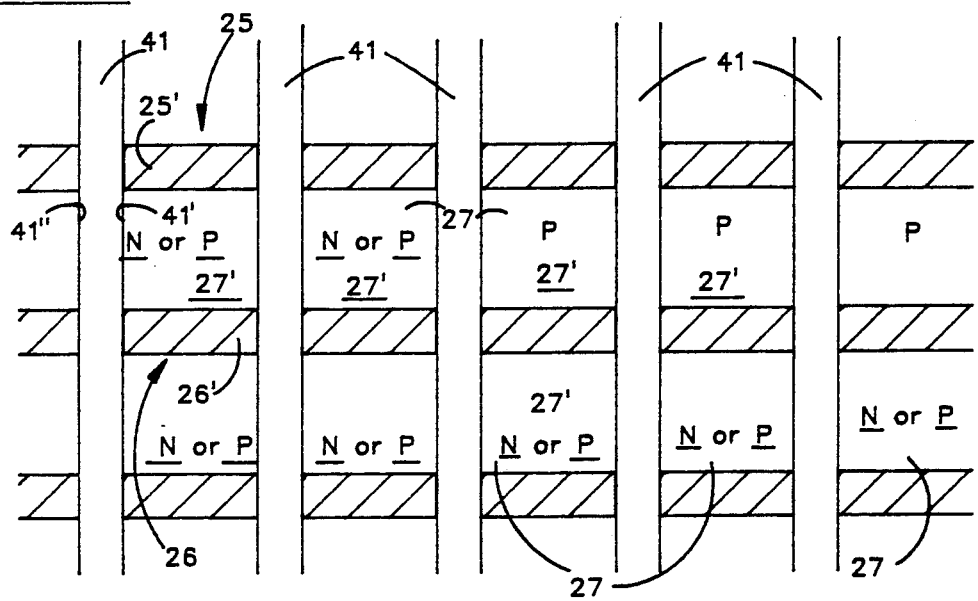
FIG. 7 shows the introduction of orthogonal slots relative to the pairs of intersecting slots.

In FIG. 7, orthogonal slots 41 divide the semi-arrays 27 into the individual transistor regions 27' and provide ingress for the doping to follow. Thus, each orthogonal slots 41 includes sidewalls 41' through which individual transistor regions 27' will be doped. The other sidewalls 41" of slots 41 provide for doping adjacent transistor regions 27'. Slots 41 may be ion milled using the masking technique heretofore employed. Consequently, photoresist 43 (FIG. 8) or a heavy metal is patterned as shown in FIG. 8 to provide for ion milling slots 41 via the openings 45 in the heavy photoresist 43 and silicon oxide layer 42. The ion flux is illustrated by the lines 46.

In FIG. 8A, it may be seen that the N+ regions 31 and 33 are implanted by ion implanting at an angle as illustrated by the ion beams 10 and 11. It is important to note that the angle of the ion beams relative to the slot directions is such that the N+ implanting does not extend to the full depth of the slots 23 and 25. Actually the corners of the silicon oxide layer 42 form a shadowing effect and cooperate with the orientation of the beams 10 and 11 in fixing the N+ doped regions within the P active region 27. Phosphor or other donors may be employed in this step. Dotted lines 31' and 33' show that the doping has been driven in and the N+ regions 31 and 33 considerably enlarged. This may be accomplished through the application of heat over a controlled period of time and temperature.

Figure 9:
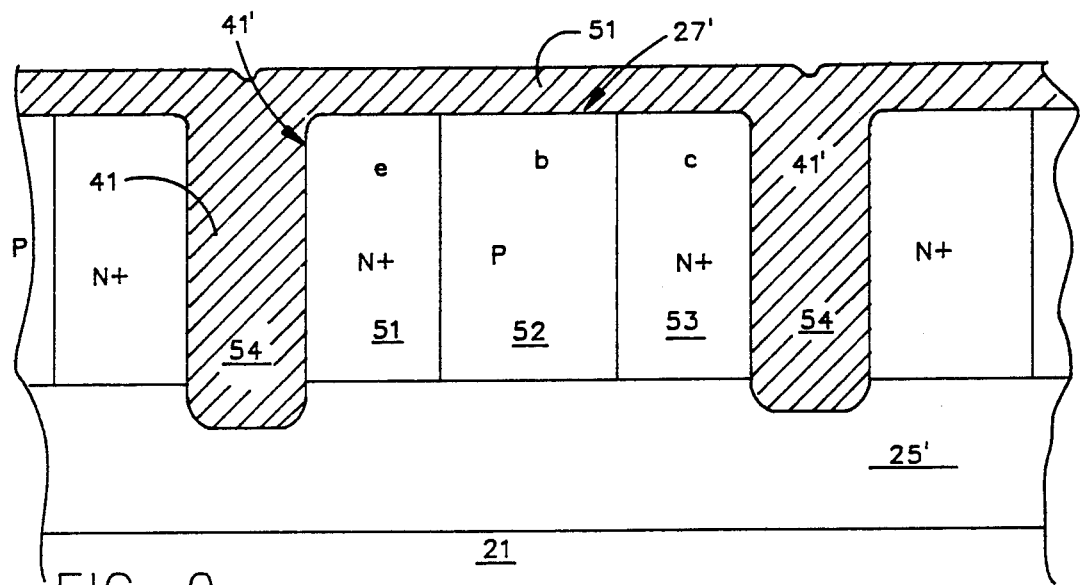
FIG. 9 is a view of a single active transistor region following N+ doping via the orthogonal slots and prior to oxidation filling the same.

In FIG. 9, an individual transistor region 27' is shown comprising N or N+ doped region 51, P or P+ doped region 52 and N or N+ doped region 53. The P region 52 is the base region and comprises a portion of the original substrate 21, e.g., doped P at formation 2 in FIG. 1. However, both N+ regions 51 and 53 are provided by doping region 27' via the sidewalls 41' and 41" of orthogonal slots 41 (FIG. 7) with phosphorus deposition, diffusion or implantation plus drive-in to create the emitter region 51 and the collector region 53. Thereafter, the structure of FIG. 9 is oxidized to fill in slots 41 with silicon oxide 54 and provide covering layer 51.

Figure 10:
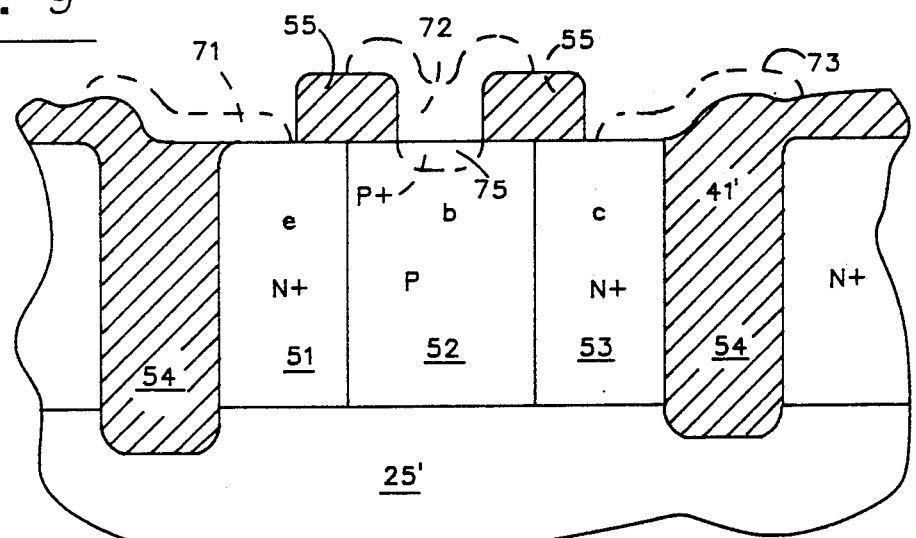
FIG. 10 is a view of the structure of FIG. 9 with metallization contacts for the emitter, base and collector regions.

The next step in the process is illustrated in FIG. 10 wherein the silicon oxide layer 51 has been patterned to leave oxide islands 55 and metallization applied to comprise the emitter electrode 71, base electrode 72 and collector electrode 73. However, prior to applying the metallization, a light boron deposit may be made in the base region 52 to provide the P+ base spanning region 75, if desired.

The purpose of the boron deposition 75 prior to the metallization is two fold, i.e., first to reduce the base region contact resistance and second to produce a potential barrier P+/P that will deflect the electrons in transit across the base region 52 away from the base contact.

Figure 11:
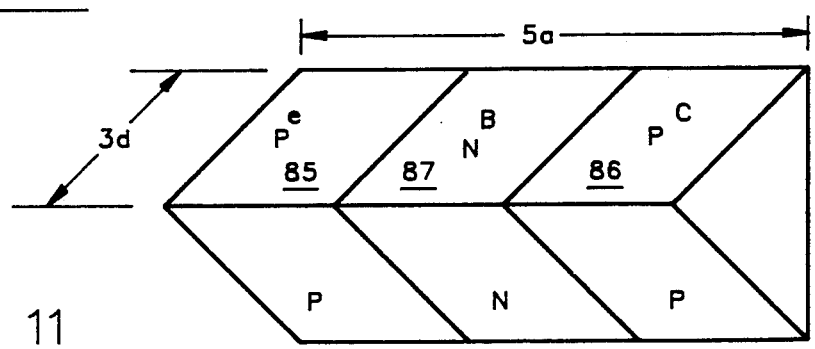
FIG. 11 shows a PNP active region, per se.

Finally, a PNP device can be built utilizing a P-type substrate in the manner of having built the NPN device starting from a P substrate as described in region 3, FIG. 1. This is shown in FIG. 11 wherein emitter region 85 is conventionally P doped, but by angled ion flux via the slots 101, 102 (FIG. 1) just as in the process for the NPN transistors. Collector region 86 is similarly formed, and base region 87 is part of the original N doped substrate 3 (FIG. 1).

Patterning of the silicon oxide on the top of this complementary device has been shown and it is only necessary to lay down the metallization pattern for electrical connection to the various transistor regions.

Interconnections of the complementary transistors may be established using conventional diffused lines, poly lines or metal patterning.

It should be mentioned that the N and P formations need not be at right angles but this arrangement insures that ion doping is carried out most efficiently and there are no components of doping intended for NPN transistors which dope the complementary PNP transistors. This orientation facilitates higher speed and more efficient processing.

The dielectrically isolated complementary transistors of this invention have no junction curvature and thus exhibit higher breakdown voltages. Also, they exhibit very low capacitances, i.e., $C_{cb}$, $C_{be}$, and $C_{cs}$. Similarly, bulk resistance is very low (i.e.) $r_{bb}'$, $r_{cc}'$ and $r_{ee}'$. Symmetrical transistors are readily available with very low $V_{CE}$ at $I_c=0$. Also available is high B at low current levels (<1nA), with no current crowding at the higher current levels. By the use of oversize geometry, close control over transistor parameters is possible with respect to the absolute values, and more importantly, the matching tolerances, partly due to the excellent control available with respect to base width since it is now a function of lateral geometry and not of the small differences of two diffusions as in conventional double diffused transistors.

An alternative method for forming contacts, particularly to very small dimensions, is set forth in FIGS. 13-28.

In FIG. 13, the collector, base and emitter 201, 202 and 203 are depicted in a lateral arrangement, as seen in top plan. Doping of these elements has been accomplished as described through FIG. 9.

In FIG. 13, the collector 201 is shown as being N doped, the base 202 is P doped and the emitter 203 is N doped, all surrounded by oxide.

The first step in building sub-micron contacts (i.e., 0.1 to 0.25 micron by 0.1 to 0.25 micron) for these devices is to deposit undoped polysilicon to approximately 5000 angstroms or less for such diminutive contacts. This layer is shown at 205 in FIG. 14. This step may be applied to the structure of FIG. 9, once the upper layer is removed. The contact doping steps of FIGS. 21 and 23 would, of course, be switched for a PNP device.

Returning to FIG. 14, a layer 206 of nitride is deposited to a thickness of approximately 1000 angstroms over layer 205.

The mask 207 of FIG. 15 is employed with photoresist to delineate the nitride 206, thereby leaving the nitride buttons 211, 212 and 213 over the collector 201, base 202 and emitter 203 respectively (FIG. 16).

To insure ultimate planarization, a portion of the polysilicon is etch removed (FIG. 17). This may comprise 2500 angstroms of polysilicon. A non-selective or anisotropic etch is employed so that only the polysilicon is removed.

Next, the resist 208, 208' and 208" is stripped and the polysilicon is then oxidized to become polyoxide 221, shown in FIG. 18. The nitride buttons 211, 212 and 213 are removed using a selective or wet etch conventional step. The polyoxide 221 also fills in the spaces between the contacts 315, 260 and 317 and rises slightly above the contacts to insulate them.

FIG. 18 shows the structure after the nitride buttons 211, 212 and 213 have been removed.

In FIG. 19, mask 250 is used, together with photoresist 251, to open aperture 253 to the P doped base 202, (FIG. 20) for boron implanting into the base electrode 260 to insure contact to base 202. Implanting is carried out using a 60 Kev implanter with a 1 to $5 \times 10^{15}$ ions per cm² dose.

Next, the photoresist 251 is stripped and a new layer 271 applied for use with the mask 270 (FIG. 21) to open the new layer of photoresist 271 above the collector 201, and emitter 203. The phosphorus ions are implanted, the photoresist 271 is stripped and the device of FIG. 22 is annealed for the implants at 800° C. for 40 minutes in a nitrogen atmosphere.

In FIG. 23, a metal layer 300 has been applied over the structure polyoxide 221 and other structure and the metal mask of FIG. 25 is applied, and the metal is etched to provide a metal interconnect 311 (FIG. 26) to the doped poly electrode 315 of collector 201, interconnect 312 to the doped poly electrode 260 of base 202 and interconnect 313 to the doped poly electrode 317 of emitter 203.

FIG. 26 shows a completed device.

FIG. 27 shows relative sizes for the bipolar device, the elements themselves, such as the collector, measuring 0.3 by 0.3 microns and the contact regions, measuring 0.1 by 0.1 microns.

Yet another alternative method for forming the contacts is disclosed, beginning with FIG. 25 wherein the three elements collector 201, base 202 and emitter 203 are first covered by polysilicon 205 to a depth of, e.g., approximately 3000 angstroms, and nitride 325 is deposited to a depth of, e.g., approximately 1000 angstroms. Mask 327 serves to form the nitride buttons 211, 212 and 213 (the same as before).

These nitride buttons 211-213 are preferably centered over the collector 201, base 202 and emitter 203 as seen in FIG. 30, although considerable leeway is available for any misalignment, as is apparent from FIG. 43.

In FIG. 31, the unprotected polysilicon 205 is removed in conventional manner, such as by etching to leave undoped polysilicon contacts 205, 205', and 205".

In FIG 32, plasma oxide 329 is deposited using the conventional planarization process to a depth of approximately 3000 angstroms. This step is followed by spinning on glass 327 (SOG) so as to look substantially planar.

In FIG. 33, a reactive ion etching (RIE) conventional step is carried out for effecting planarization which exposes the nitride buttons 211, 212 and 213 and is terminated approximately at the level of the tops of these buttons.

In FIG. 34, the nitride buttons 211, 212 and 213 have been removed from the contacts 205, 205' and 205" using a conventional step to prepare the contacts for doping to make them properly conductive.

In FIG. 35, mask 250 is shown for delineating photoresist 251, in the previous manner, to provide the opening for the boron implant, as shown by the arrows in FIG. 36.

In similar fashion, mask 270 of FIG. 36A, is again utilized to delineate the photoresist 271 for the phosphorus implants, shown by the arrows (FIG. 37), thereby concluding the doping of the three polysilicon contacts 205, 205' and 205" in the same N or P doping as their underlying collector, base and emitter.

In FIG. 38, the metal layer 300 has been applied over this structure, and the metal mask of FIG. 40, shown at 300', is used and the metal to provide the metal interconnects 311 (FIG. 39) to the doped poly electrode 205 of collector 201, interconnect 312 to the doped poly electrode 205' of the base 202 and interconnect 313 to the doped poly electrode 205" of emitter 203.

FIG. 41 shows the completed device made in this fashion.

Finally, FIG. 42 shows, by way of example, relative sizes for the bipolar device, the elements themselves such as the collector measuring 0.3 by 0.3 microns and the contact regions measuring 0.1 by 0.1 microns.

The use of an E-beam fabricator, guided by the masks successively used herein, makes the VLSI contacts of the order of these dimensions. Of course, larger contacts might be readily utilized. This technique is accomplished through the use of polysilicon which remains in the electrode areas, but is converted to polyoxide in the remaining areas with the nitride buttons guarding against oxidation of the polysilicon electrode areas.

If desired, single MOS or bipolar devices may be made, and it is only necessary to insulate them by isolation, usually in lieu of the field oxide, illustrated.

This method is also applicable to MOS, GaAs and conventional bipolar minimal size contacts obtained down to 0.1×0.1 microns, or to 0.1 micron diameter where the spot size is 0.1 micron, or up to 1 micron sizes or larger.

In summary, the following advantages are achieved by this invention:
1. Sub-micron contact technology.
2. Contact integrity without the need of excessive silicon content in the metal or contact barriers such as Titanium Nitride, etc.
3. Planar structures without severe steps to hinder metal step coverage, or restrictions for proximity of contact to vias to gates, thereby improving packing density.
4. Principle applicable to MOS (NMOS, PMOS, CMOS, etc.), Bipolar devices and GaAs technologies.
5. Contact technology compatible with shallow junctions and other state of the art processes such as selective silicides.
6. Minimum overlap of metal for interconnects.
7. Via overlap of contact realizable with this technique.

What is claimed is:

1. An array of sub-micron dimensioned complementary NPN and PNP type lateral transistors formed in a silicon substrate selectively doped P and N type, comprising in combination:
 a plurality of first sidewalls of pairs of intersecting slots in spaced apart relation across the P regions of the substrate defining semi-arrays of V shaped intermediate regions, which regions will become NPN transistors;
 a plurality of second sidewalls of spaced apart orthogonal slots relative to said pairs of slots dividing the semi-arrays of regions into individual transistor NPN active regions;
 selective N doping introduced into said active regions via said second sidewalls and driven in to comprise emitter and collector regions on respective sides of original P substrate comprising the respective P base regions;
 a second plurality of further first sidewalls of pairs of intersecting slots in spaced apart relation across the N regions of the substrate defining further semi-arrays of V shaped intermediate regions, which regions will become PNP transistors;
 a second plurality of further second sidewalls of spaced apart orthogonal slots relative to said second plurality of intersecting slots dividing the further semi-arrays of N regions into individual PNP transistor active regions;
 selective P doping introduced into said active regions via said further second sidewalls and driven in to comprise emitter and collector regions on respective sides of original N substrate comprising the respective N base regions;
 silicon oxide filling all said slots and covering the surface of the substrate through which they were made; and
 an electrical contact in electrical connection with each emitter, base and collector region.

2. Transistor arrays in accordance with claim 1, wherein:
 said pairs of intersecting slots for the NPN transistors are normal to said pairs of intersecting slots for the PNP transistors; and,
 said orthogonal slots for the NPN transistors are normal to said orthogonal slots for the PNP transistors.

3. An array of sub-micron dimensioned PNP and NPN type lateral complementary transistors formed on a silicon substrate selectively doped N and P type in different substrate regions, comprising in combination:
 a plurality of first sidewalls of pairs of intersecting slots in spaced apart relation across N doped regions of the substrate defining semi-arrays of V shaped intermediate regions which will become PNP transistors;

a plurality of sidewalls orthogonal to said first sidewalls comprising further pairs of intersecting slots in spaced apart relation across P doped regions of the substrate defining semi-arrays of V shaped intermediate regions which will become NPN transistors;

silicon oxide filling said slots and covering the surface of the substrate through which they were made;

a plurality of second sidewalls of orthogonal slots relative to said pairs of slots dividing the semi-arrays of regions into individual transistor active regions;

N and P doping selectively introduced into selected ones of said active regions via said second sidewalls and driven in to comprise emitter and collector regions on respective sides of original N or P substrate comprising the base regions;

an electrical contact in electrical connection with each of the respective emitter, base and collector regions; and, silicon oxide at least substantially covering the periphery of each active region.

4. A pair of NPN PNP complementary transistors formed on a common substrate, comprising in combination:

an N doped portion of said substrate;

a pair of intersecting slots in said portion filled with substrate oxide defining the length of the PNP transistor;

an orthogonal pair of slots in said N portion relative to said intersecting slots through which P doping is driven into the ends of said PNP transistor to comprise the collector and emitter respectively, said base being comprised of N doped substrate;

said orthogonal slots filled with substrate oxide;

a P doped portion of said substrate;

a second pair of intersecting slots in said P portion filled with substrate oxide defining the length of the NPN transistor;

a second pair of orthogonal slots in said P portion relative to said second pair of intersecting slots through which N doping is driven into the ends of said NPN transistor to comprise the collector and emitter respectively, said base being comprised of P doped substrate;

said second pair of orthogonal slots filled with substrate oxide; and, a contact in electrical connection with each emitter, base and collector.

5. NPN and PNP complementary transistors each having an active region formed in a common substrate which has a P doped area and an N doped area, comprising the steps of:

locating the transistor regions to become NPN transistors in P doped areas and the transistor regions to become PNP transistors in the N doped areas;

recessing the substrate substantially along the periphery of each transistor region in the respective areas;

selectively doping the transistor regions N in the P doped area and P in the N doped are through portions of the recesses formed by said recessing to form an emitter and a collector in each transistor region, using the respective P and N doped areas between said collector and emitter as the base for each active region now formed;

at least partly filling said recesses with substrate oxide to isolate the active regions from said substrate; and forming contacts to different portions of each active region respectively comprising said emitter, collector and base to serve as electrode connections.

6. The complementary transistors of claim 5, wherein:

said doping is accomplished by ion bombardment into electrode portions of said active regions via said portions of said recesses at an angle of less than 90° relative to the substrate.

7. The complementary transistors of claim 6 wherein:

said recessing separates said active regions from the substrate; and said substrate oxide envelops each active region to insure supporting of each active region.

* * * * *